United States Patent [19]

Sato

[11] Patent Number: 4,524,508
[45] Date of Patent: Jun. 25, 1985

[54] METHOD OF MANUFACTURING SEMICONDUCTOR DEVICE

[75] Inventor: Shinichi Sato, Itami, Japan

[73] Assignee: Mitsubishi Denki Kabushiki Kaisha, Tokyo, Japan

[21] Appl. No.: 517,984

[22] Filed: Jul. 29, 1983

[30] Foreign Application Priority Data

Aug. 25, 1982 [JP] Japan .................. 57-148701

[51] Int. Cl.³ .................. H01L 21/22; H01L 21/306
[52] U.S. Cl. .................. 29/571; 29/578; 29/577 C; 148/1.5; 357/4; 357/23.11; 357/54; 156/643; 156/657
[58] Field of Search ............ 29/571, 578, 577 R, 29/577 C; 148/1.5, 187, 774, 175; 357/4, 23, 54, 59; 156/643, 657

[56] References Cited

U.S. PATENT DOCUMENTS 4,234,362 11/1980 Riseman .................. 29/578 X
4,368,085 1/1983 Peel .................. 29/571 X
4,385,432 5/1983 Kuo et al. .................. 29/577 C X
4,413,402 11/1983 Erb .................. 29/571

Primary Examiner—Brian E. Hearn
Assistant Examiner—David A. Hey
Attorney, Agent, or Firm—Lowe, King Price & Becker

[57] ABSTRACT

A method of manufacturing a semiconductor device comprises forming a mask of a predetermined pattern on a first conductive layer (3) deposited over a semiconductor substrate (1) and etching physically first conductive layer so that the side surfaces thereof are substantially perpendicular to a surface of the semiconductor substrate. After removing the mask on the pattern, a first insulating layer (7) is deposited over the whole upper surface of the semiconductor substrate including the first conductive layer. A physical etching is made over the first insulating layer until the surface of the semiconductor substrate is exposed, so that a portion (7a) of the first insulating layer (7) is left in a stepped portion of the side surfaces of the first conductive layer. Then, a second insulating layer (5) is formed over a whole upper surface of the semiconductor substrate including the portion (7a) of the insulating layer and the first conductive layer. Subsequently, a second conductive layer (6) is formed over the whole upper surface thereof.

6 Claims, 9 Drawing Figures

FIG. 2
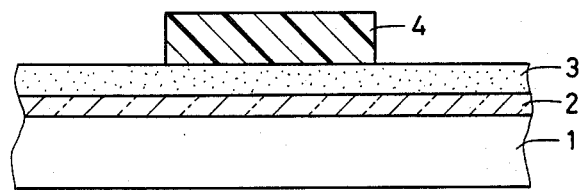
FIG. 2A
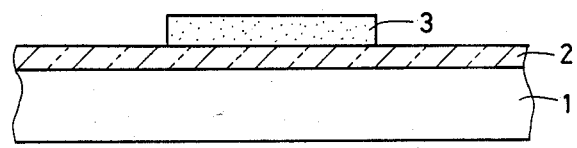
FIG. 2B
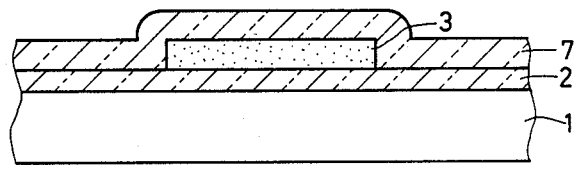
FIG. 2C
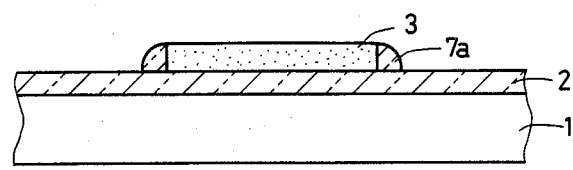
FIG. 2D
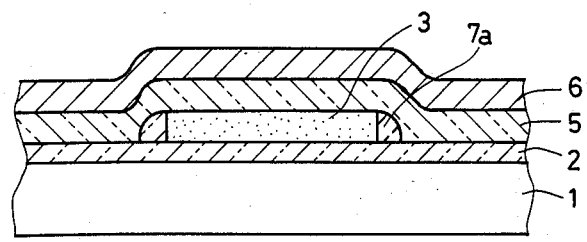
FIG. 2E

METHOD OF MANUFACTURING SEMICONDUCTOR DEVICE

BACKGROUND OF THE INVENTION

1. Field of the Invention

The present invention relates to a method of manufacturing a semiconductor device. More particularly, the present invention relates to an improvement of a method of forming a fine pattern such as electrodes and wiring in a semiconductor device.

2. Description of the Prior Art

Conventionally, a chemical etching process, such as a wet etching process using a mask of a photoresist and the like and a plasma etching process, has been widely used for the purpose of forming electrodes and wiring in a semiconductor device. On the other hand, in order to satisfy a recent requirement of fining a pattern, a physical process such as an ion etching for making a fine process possible, has been used, rather than the above described chemical etching, or an approach of combining the physical process with the chemical etching process has been used. The physical etching process has an advantage in that such a process is suitable for formation of a fine pattern and it is easy to control a finished size, since an etching is made in a direction almost perpendicular to a surface to be processed and is not made in a lateral direction. On the other hand, for a finished shape or configuration which is sharpened, various kinds of problems arise.

FIGS. 1A to 1D are cross sectional views showing the states in major steps for explaining a conventional physical etching process. First, as shown in FIG. 1A, silicon oxide film 2 is formed on a silicon substrate 1 and then, a polycrystal silicon (referred to as "a polysilicon" hereinafter) as wiring material is formed on a whole surface of the silicon oxide film 2, in a thickness of approximately 0.5 $\mu$m. Then, a photoresist mask 4 of a desired shape is formed on the polysilicon 3 for etching the polysilicon film 3 into a desired pattern. Subsequently, an etching is made within parallel electrodes in the atmosphere of a plasma such as $C_3F_8$. As a result, as shown in FIG 1B, a wiring pattern of the polysilicon 3 is formed into a desired size with good precision. Thereafter, the photoresist mask 4 is removed. Then, as shown in FIG. 1C, an insulating film 5 such as a silicon oxide film is deposited on the silicon oxide film 2 and the polysilicon 3 by the chemical vapour deposition process, for example. However, since the shape of the polysilicon 3 is sharpened in an arrow portion in FIG. 1C, coverage in a stepped portion of the insulating film 5 is provided with undesirable characteristics. Thus, as shown in FIG. 1D, if an aluminum wiring 6 is formed thereon, disconnection occurs in the aluminum wiring 6 in the stepped portion as indicated in the arrow and, depending on the situation, a short circuit between the aluminum wiring 6 and the polysilicon 3 may occur due to a pin hole or the like caused in the stepped portion of the insulating film 5.

Thus, a desired fine processing sharpens the shape of the stepped portion and hence the fine processing is incompatible with the requirement that the shape of the stepped portion be made smooth. In addition, there are so many problems other than the examples as shown in FIGS. 1A to 1D. The countermeasure for coping with these problems is that a phosphate silicate glass (PSG) film is used as an insulating film 5 in the step of FIG. 1C, so that the reflow thereof at the temperature of over 1000° C. causes the stepped portion to be made smooth. However, this approach has a disadvantage in that unnecessary rediffusion of impurity occurs due to heat treatment at the high temperature which adversely affects the structure of the device and for this reason, the heat treatment at high temperature is used in the restricted application. In addition, in a case where a metal having a low melting point, such as aluminum, is used for wiring, an insulating film should be deposited on the metal by a lower temperature (for example, less than 500° C.). As described in the foregoing, there has been no desirable process for securely achieving a fine process and a smoothing of a stepped portion.

SUMMARY OF THE INVENTION

Accordingly, a principal object of the present invention is to provide a method of manufacturing a semiconductor device capable of making a desired fine processing of a pattern and the like and also making smooth a shape of a stepped portion in a conductive layer.

Briefly stated, the present invention is directed to a method of making a semiconductor device such that, when a predetermined pattern is formed by a first conductive layer on a semiconductor substrate, a physical etching is made so that a cross section of the pattern is substantially perpendicular to the semiconductor substrate; after a first insulating layer is formed over an upper whole surface of the semiconductor substrate including the pattern, a physical etching is made to the first conductive layer until the substrate is exposed, so that a portion of the first insulating layer is left on a sharpened stepped portion of the side surfaces of the pattern, resulting in a smooth stepped portion at the side surface of the pattern; and a second insulating layer and a second conductive layer are formed thereon.

Therefore, in accordance with the present invention, a side surfaces of a pattern can be made perpendicular to a semiconductor substrate by making a physical etching to a first conductive layer to form a pattern, which is suitable for forming of a fine pattern. Then, since the sharpness of the side surfaces of the pattern is made smooth in the stepped portion thereof, a second insulating layer and a second conductive layer are formed thereon. The second conductive layer can be prevented from being disconnected due to a sharpened shape of the first conductive layer and a shortcircuit between the first conductive layer and the second conductive layer can be prevented. As a result, a semiconductor device can be obtained with high reliability.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2E are cross-sectional views showing the steps of the present invention.

DESCRIPTION OF THE PREFERRED EMBODIMENT

Figure 1A:
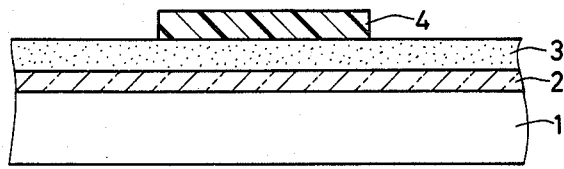
FIGS. 1A to 1D are cross-sectional views showing the steps in manufacturing a semiconductor device using a conventional physical etching.
Figure 1B:
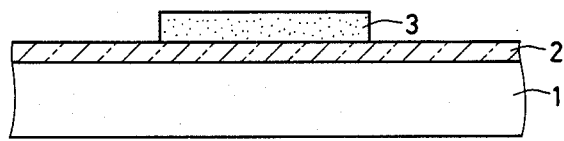
Figure 1C:
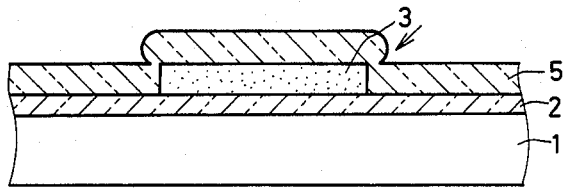
Figure 1D:
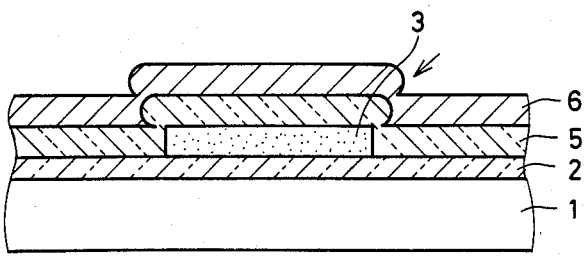

FIGS. 2A to 2E are cross-sectional views showing the major steps of the present embodiment in accordance with the present invention, wherein the same reference numerals as the prior art indicate the same or similar portions. The steps in FIGS. 2A and 2B are exactly the same as those in FIGS. 1A and 1B. Thus, a wiring pattern with good precision is formed by making a physical etching to the polysilicon 3 and the photoresist mask 4 is removed. Thereafter, as shown in FIG. 2C, a silicon oxide film 7 is formed all over the exposed upper surface of the silicon oxide film 2 and the polysilicon 3 in a thickness of approximately 0.5 μm which is approximately the same as the thickness of the polysilicon 3. Then, a physical etching is made to the whole surface of the silicon oxide film 7 between parallel electrodes in an atmosphere of a plasma of $C_3F_8$. In this case, the etching is made until the silicon oxide film 7 on the polysilicon 3 or the silicon oxide film 2 is completely removed. As a result, since the thickness of the silicon oxide film 7 in a direction perpendicular to the surface of the substrate is thick in a stepped portion, a portion of the silicon oxide film 7a is left in the stepped portion as shown in FIG. 2D if the etching progresses only in a direction perpendicular to the substrate surface. The shape thereof can be controlled by the thickness of the polysilicon 3, the thickness of the silicon oxide film 7, a process of forming the silicon oxide film 7, and the like. Thus, the silicon oxide film 7a can be formed for making smooth the sharpened side surface portions of the polysilicon 3. Subsequently, as shown in FIG. 2E, an insulating film 5 and aluminum wiring 6 are formed thereon by a conventional process. Even in such a case, no problem occurs such as disconnection, shortcircuit and the like in the stepped portion.

Although the specific embodiment has been described in the foregoing, the present invention should not be restricted to the above described embodiment. For example, the present invention directly applies to a case where a sharpened stepped portion is made smooth which is obtained by making a physical etching to a film comprised of conductive material. On the other hand, a sharpened stepped portion such as a contact hole can be made smooth by covering the side wall of an oxide film of a contact portion with metal wiring material. In essence, the present invention widely applies to cases necessary for enhancing the reliability of upper layer portions by making smooth portions of a sharpened shape, irrespective of material, process and the like.

In addition, the portion corresponding to the wiring polysilicon 3 in the above described embodiment may comprise all kinds of metals having a low melting point or a high melting point, or noble metals, and instead of the silicon oxide film 7, other insulating oxide film, silicon nitride film and any other nitride insulating film may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming a first conductive layer (3) over a semiconductor substrate (1),
   masking a predetermined pattern on said first conductive layer (3) and then physically etching said first conductive layer (3) to provide side surfaces of said predetermined pattern substantially perpendicular to the surface of the said semiconductor substrate (1),
   forming a first insulating layer (7) over the surface of said semiconductor substrate (1) and directly on said first conductive layer (3) after removal of the mask on said predetermined pattern,
   physically etching said first insulating layer (7) until said first conductive layer is exposed in said first insulating layer (7) formed over said semiconductor substrate (1), so that a portion of said first insulating layer (7a) is left in a stepped portion at the side surfaces of said first conductive layer (3),
   forming a second insulating layer (5) over the surface of said semiconductor substrate (1) and on said left portion of said first insulating layer (7a) and on said first conductive layer (3) etched to the predetermined pattern, and
   forming a second conductive layer (6) over a whole upper surface of said second insulating layer (5).

2. A method of manufacturing a semiconductor device in accordance with claim 1, wherein
   said first conductive layer comprises metal.

3. A method of manufacturing a semiconductor device in accordance with claim 1, wherein
   said first conductive layer comprises a polycrystal silicon.

4. A method of manufacturing a semiconductor device as recited in claim 1 wherein said step of forming said first insulating layer comprises the further step of forming said first insulating layer to a thickness approximately equal to the thickness of said first conductive layer.

5. A method of manufacturing a semiconductor device as recited in claim 4 wherein said first conductive layer and said first insulating layer are formed to be approximately 0.5 μm in thickness.

6. A method of manufacturing a semiconductor device, comprising the steps of:
   forming a first conductive layer on a surface of a semiconductor substrate having an insulating film thereover,
   masking a predetermined pattern on said first conductive layer and then physically etching said first conductive layer to provide side surfaces of said predetermined pattern substantially perpendicular to the surface of the said semiconductor substrate,
   forming a first insulating layer over the insulating film surface and directly over said first conductive layer after removal of the mask on said predetermined pattern,
   physically etching said first insulating layer until said insulating film and said first conductive layer are exposed, so that a portion of said first insulating layer is left in a stepped portion at the side surfaces of said first conductive layer,
   forming a second insulating layer over the insulating film on said semiconductor substrate and over said left portion of said first insulating layer and said first conductive layer etched to the predetermined pattern, and
   forming a second conductive layer over the upper surface of said second insulating layer.

* * * * *